(12) United States Patent
Endoh et al.

(10) Patent No.: US 8,187,382 B2
(45) Date of Patent: May 29, 2012

(54) POLYCRYSTALLINE SILICON MANUFACTURING APPARATUS

(75) Inventors: Toshihide Endoh, Suzuka (JP);
Masayuki Tebakari, Suzuka (JP);
Toshiyuki Ishii, Yokkaichi (JP);
Masaaki Sakaguchi, Suzuka (JP)

(73) Assignee: Mitsubishi Materials Corporation, Tokyo (JP)

( * ) Notice: Subject to any disclaimer, the term of this patent is extended or adjusted under 35 U.S.C. 154(b) by 524 days.

(21) Appl. No.: 12/382,658

(22) Filed: Mar. 20, 2009

(65) Prior Publication Data
US 2009/0241838 A1    Oct. 1, 2009

(30) Foreign Application Priority Data

Mar. 27, 2008    (JP) .................................. 2008-084308

(51) Int. Cl.
*C30B 35/00*    (2006.01)
(52) U.S. Cl. ............. 117/205; 117/200; 117/84; 117/88
(58) Field of Classification Search .................. 117/200, 117/205, 84, 88
See application file for complete search history.

(56) References Cited

U.S. PATENT DOCUMENTS

| 3,941,900 A | 3/1976 | Stut et al. |
| 4,150,168 A * | 4/1979 | Yatsurugi et al. ............. 427/588 |
| 5,545,387 A | 8/1996 | Keck et al. |
| 6,503,563 B1 * | 1/2003 | Yatsurugi et al. ........ 427/255.27 |
| 2003/0127045 A1* | 7/2003 | Keck et al. .................... 117/200 |
| 2007/0251447 A1 | 11/2007 | Muller et al. |
| 2010/0221454 A1* | 9/2010 | Kim et al. ..................... 427/588 |

FOREIGN PATENT DOCUMENTS

| JP | 2007-107030 | 4/2007 |
| WO | WO 2007136209 A1 * | 11/2007 |

OTHER PUBLICATIONS

European Search Report dated May 28, 2009, issued on the corresponding European patent application No. 09155901.3.

* cited by examiner

*Primary Examiner* — Matthew Song
(74) *Attorney, Agent, or Firm* — Edwards Wildman Palmer LLP

(57) ABSTRACT

A polycrystalline silicon manufacturing apparatus is provided which supplies raw gas to the inside of a reaction furnace and supplies a current from an electrode to a silicon seed rod in a state where the vertically extending silicon seed rod is uprightly stood on each of the plural electrodes disposed in a bottom plate portion of the reaction furnace so as to heat the silicon seed rod and thus to deposit polycrystalline silicon on a surface of the silicon seed rod by means of the reaction of the raw gas.

6 Claims, 5 Drawing Sheets

POLYCRYSTALLINE SILICON MANUFACTURING APPARATUS

BACKGROUND OF THE INVENTION

1. Field of the Invention

The present invention relates to a polycrystalline silicon manufacturing apparatus which manufactures a polycrystalline silicon rod by depositing polycrystalline silicon on a surface of a heated silicon seed rod.

Priority is claimed on Japanese Patent Application No. 2008-084308, filed Mar. 27, 2008, the content of which is incorporated herein by reference.

2. Description of the Related Art

Conventionally, as this kind of polycrystalline silicon manufacturing apparatus, a polycrystalline silicon manufacturing apparatus using the Siemens method is known. In the polycrystalline silicon manufacturing apparatus using the Siemens method, plural seeds made of silicon are arranged in a hermetic reaction furnace and are heated, raw gas composed of a mixed gas of chlorosilane and hydrogen is supplied to the reaction furnace to contact with the heated silicon seed rods, and then deposit polycrystalline silicon on surfaces thereof by means of hydrogen reduction and thermal decomposing of the raw gas.

In the polycrystalline silicon manufacturing apparatus, the silicon seed rod serving as a seed is uprightly stood on an electrode disposed in the bottom of the reaction furnace, a current is supplied from the electrode to the silicon seed rod so as to heat the silicon seed rod by means of a resistance thereof, and then the raw gas ejected from the lower side contacts with the surface of the silicon seed rod so as to form a polycrystalline silicon rod. At this time, plural electrodes holding the silicon seed rods are installed and distributed in substantially the whole area of the bottom surface of the reaction furnace, and each electrode is surrounded by annular insulating materials in the perforation holes in the bottom plate portion of the reaction furnace as disclosed in Japanese Patent Application Laid-Open No. 2007-107030.

Incidentally, in the above-described polycrystalline silicon manufacturing apparatus, it is desirable to install the silicon seed rods in the reaction furnace in high density in order to improve productivity. However, in order to install more silicon seed rods in the reaction furnace, it is necessary to form more perforation holes in the bottom plate portion. As the number of the perforation holes increases, the rigidity of the bottom plate portion decreases, and the bottom plate portion is easily deformed. Additionally, each electrode is connected to a current-supply power source cable or a cooling pipe formed inside the electrode. Accordingly, when more electrodes are installed in the reaction furnace, many cables or pipes are densely provided below the reaction furnace, thereby causing a problem in that the maintenance workability deteriorates.

SUMMARY OF THE INVENTION

The present invention is contrived in consideration of such circumstances, and an object of the present invention is to provide a polycrystalline silicon manufacturing apparatus capable of holding many silicon seed rods without increasing the number of electrodes perforating a bottom plate portion of a reaction furnace.

In order to achieve the above-described object, according to an aspect of the present invention, there is disclosed a polycrystalline silicon manufacturing apparatus which supplies raw gas to the inside of a reaction furnace and supplies a current from an electrode to a silicon seed rod in a state where the vertically extending silicon seed rod is uprightly stood on each of the plural electrodes disposed in a bottom plate portion of the reaction furnace so as to heat the silicon seed rod and thus to deposit polycrystalline silicon on a surface of the silicon seed rod by means of the reaction of the raw gas, wherein at least a part of the plural electrodes is configured as a two-holding electrode which holds two silicon seed rods, wherein the two-holding electrode includes an electrode holder which is inserted in a perforation hole formed in the bottom plate portion and a pair of seed rod holding portions which are formed in an upper end portion of the electrode holder so as to have an interval therebetween, wherein a cooling passageway is formed in the inside of the electrode holder so as to flow a cooling medium, and wherein a lower end portion of the electrode holder perforating the bottom plate portion is connected to a cooling pipe communicating with the cooling passageway.

That is, in the polycrystalline silicon manufacturing apparatus, the one-holding electrode and the two-holding electrode are provided, and two silicon seed rods are held by the two-holding electrode. Accordingly, as compared with a structure in which each of all the silicon seed rods is held by the one-holding electrode, it is possible to decrease the number of electrodes perforating the bottom plate portion of the reaction furnace and thus to decrease the number of the perforation holes formed in the bottom plate portion of the reaction furnace and power source cables and cooling pipes provided therebelow.

Further, in the polycrystalline silicon manufacturing apparatus according to the present invention, the silicon seed rod is formed into a seed assembly in which two upper end portions of the silicon seed rods are connected to each other by a connecting member; both seed rod holding portions of the two-holding electrode hold each silicon seed rod of two pairs of seed assemblies; and the seed rod holding portions are electrically connected to each other through the electrode holder.

In the polycrystalline silicon manufacturing apparatus, since each silicon seed rod of the two pairs of seed assemblies is held by the two-holding electrode, both seed assemblies are connected to each other in series through the electrode holder. The rest of the silicon seed rods may be held by the one-holding electrode or may be connected to another seed assembly through a new two-holding electrode. Likewise, since the two-holding electrode is used as a relay point upon connecting plural seed assemblies to each other in series, the electrode serving as the relay point does not require the power source cable, thereby further decreasing the number of the power source cables below the bottom plate portion.

Furthermore, in the polycrystalline silicon manufacturing apparatus according to the present invention, plural pairs of seed assemblies can be held by a pair of the one-holding electrodes and the two-holding electrode disposed between the one-holding electrodes so as to be connected to each other in series in the form of one unit; a power source circuit which supplies a current to the seed assemblies is connected to the one-holding electrode and the two-holding electrode; and a current supply to the one unit and a current supply to separated units obtained by separating the one unit into plural units may be configured so as to be switched.

Accordingly, in the silicon seed rod having a large resistance at a low temperature, it is possible to carry out a control such as a switching operation of switching a current supply unit in accordance with a growing state thereof, and thus to promptly and efficiently carry out the heating operation.

In the polycrystalline silicon manufacturing apparatus according to the present invention, since the two-holding electrodes are provided, as compared with the structure in which each of all the silicon seed rods is held by the one-holding electrode, it is possible to decrease the number of electrodes perforating the bottom plate portion of the reaction furnace and thus to decrease the number of perforation holes formed in the bottom plate portion of the reaction furnace. Accordingly, it is possible to uprightly stand many silicon seed rods in a state where the bottom plate portion is maintained to be in a rigid structure and thus to improve the productivity of polycrystalline silicon. Further, since it is possible to decrease the number of the cooling pipes and the power source cables disposed below the reaction furnace, it is possible to improve maintenance workability thereof.

DETAILED DESCRIPTION OF THE INVENTION

Hereinafter, a polycrystalline silicon manufacturing apparatus according to embodiments of the present invention will be described with reference to the accompanying drawings.

Figure 3:
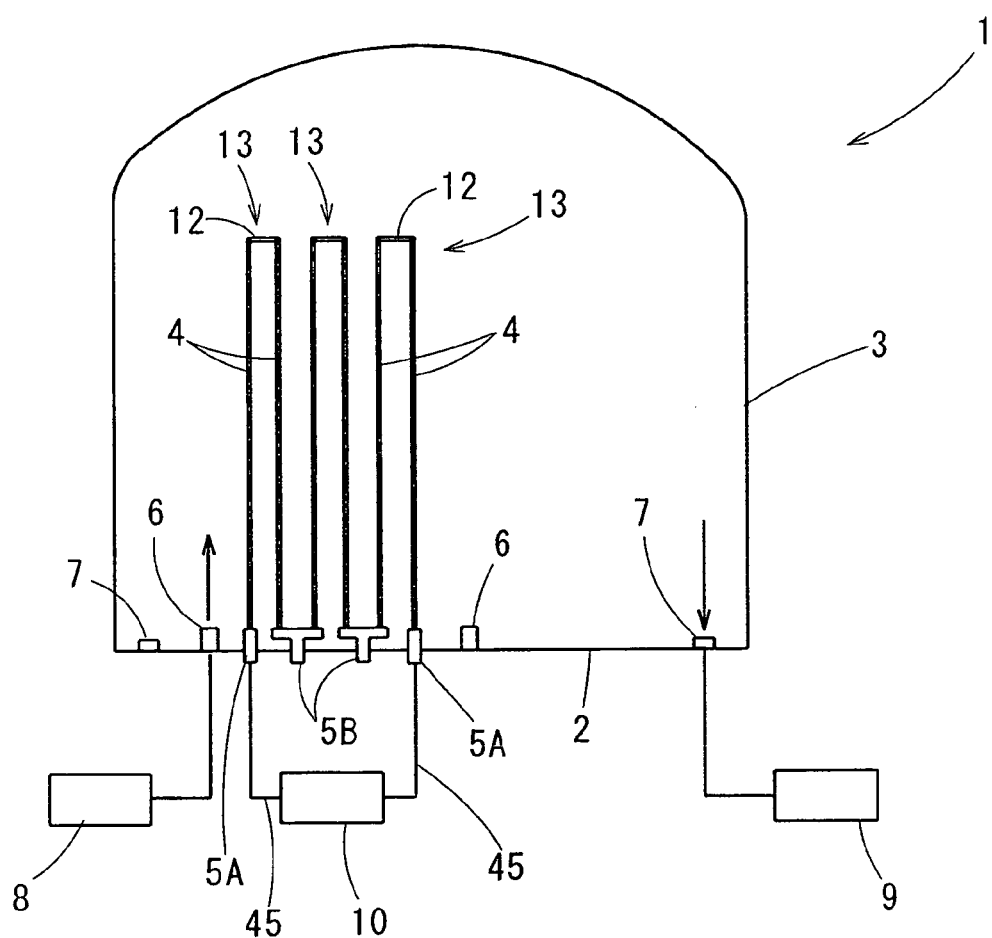
FIG. 3 is a longitudinal sectional view showing an overall configuration of the polycrystalline silicon manufacturing apparatus according to the first embodiment.

FIG. 3 is an overall view showing the polycrystalline silicon manufacturing apparatus according to a first embodiment of the present invention. A reaction furnace 1 of the polycrystalline silicon manufacturing apparatus includes a bottom plate portion 2 which forms a furnace bottom and a bell-shaped bell jar 3 which is detachably attached onto the bottom plate portion 2. In this case, an upper surface of the bottom plate portion 2 is in a substantially flat horizontal plane. The bell jar 3 is formed in a bell shape as a whole, and a ceiling is formed in a dome shape. Additionally, walls of the bottom plate portion 2 and the bell jar 3 are formed into a jacket structure and are cooled by cooling water.

The bottom plate portion 2 is provided with plural electrodes 5A and 5B which are mounted with silicon seed rods 4 serving as seed rods of deposited polycrystalline silicon, ejection nozzles (gas supply ports) 6 which are used to eject raw gas containing chlorosilane gas and hydrogen gas into the inside of the furnace, and gas exhaust ports 7 which are used to exhaust reacted gas to the outside of the furnace.

In this case, plural raw gas ejection nozzles 6 are installed in substantially the whole area of the upper surface of the bottom plate portion 2 of the reaction furnace 1 so as to be appropriately distanced from each other, thereby uniformly supplying the raw gas to the silicon seed rods 4, each ejection nozzle being connected to an external raw gas supply source 8 of the reaction furnace 1. Additionally, plural gas exhaust ports 7 are installed at a position in the vicinity of an outer peripheral portion on the bottom plate portion 2 so as to be appropriately distanced from each other in a circumferential direction and are connected to an external exhaust gas treatment system 9. Further, reference numeral 10 of FIG. 3 indicates a power source circuit connected to the electrodes 5A and 5B.

In addition, the lower end portions of the silicon seed rods 4 are stood on the electrodes 5A and 5B in an inserted state so as to extend upward in an upright manner, and the upper end portions thereof are attached with one short connection member 12 so as to be connected to each other in pairs. The connection member 12 is also made of the same silicon as that of the silicon seed rod 4. Each seed assembly 13 is assembled in an inverse U-shape or a Π-shape as a whole by means of the two silicon seed rods 4 and the connection member 12 connecting the silicon seed rods to each other. The seed assemblies 13 are arranged in a substantially concentric arrangement as a whole by means of the electrodes 5A and 5B arranged in a concentric shape with respect to a center of the reaction furnace 1.

Figure 2:
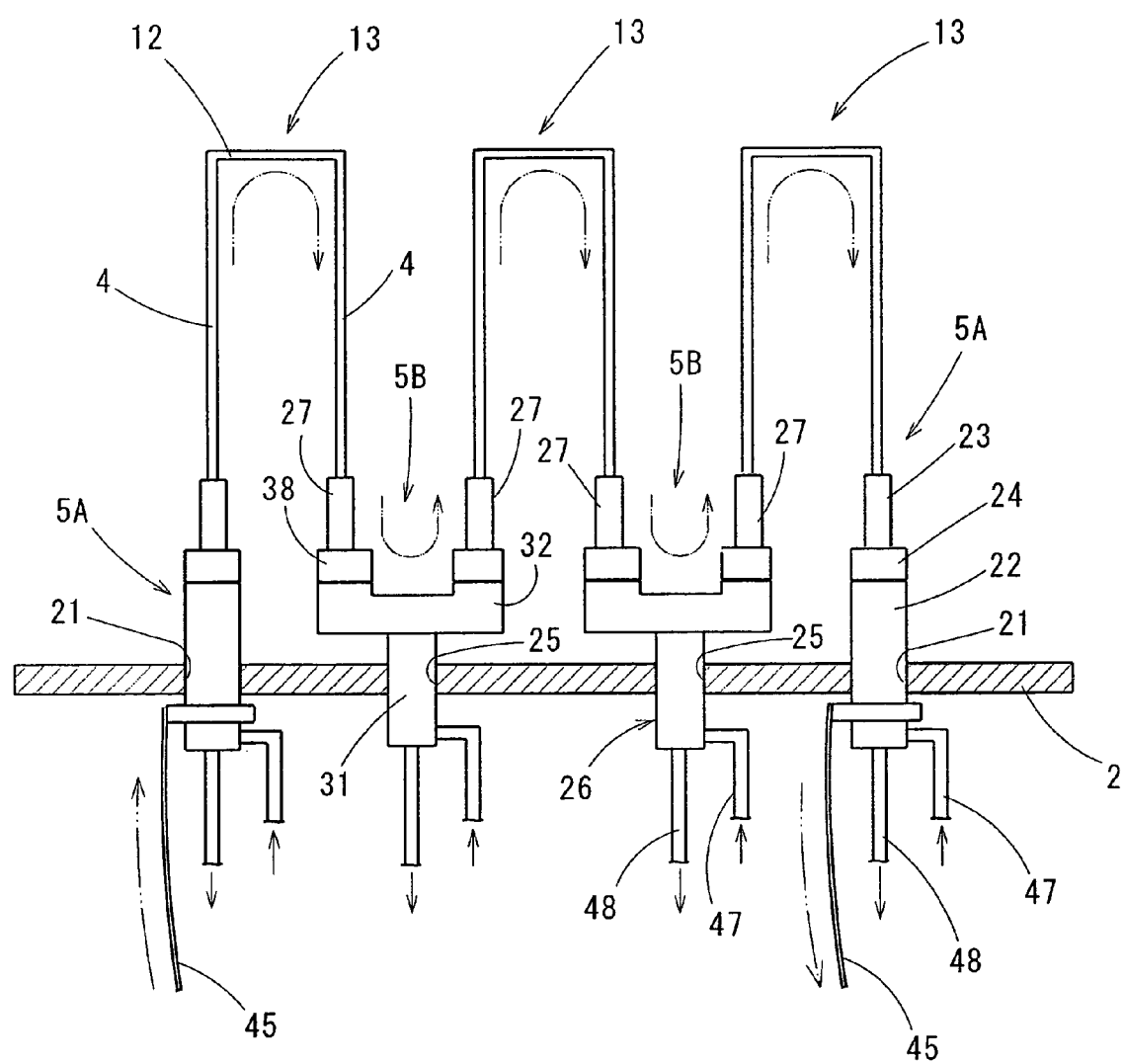
FIG. 2 is a model view showing a state where silicon seed rods are connected to each other in series by means of the electrode shown in FIG. 1.

As shown in FIG. 2, the electrodes 5A and 5B holding the silicon seed rods 4 are arranged in such a manner that one-holding electrode 5A holding one silicon seed rod 4 and two-holding electrode 5B holding two silicon seed rods 4 are arranged.

The one-holding electrode 5A includes an electrode holder 22 which is inserted in the perforation hole 21 formed in the bottom plate portion 2 of the reaction furnace 1 and a seed rod holding portion 23 which is formed in the upper end portion of the electrode holder 22. The electrode holder 22 is made of a conductive material such as stainless steel, and the seed rod holding portion 23 is made of carbon or the like. The electrode holder 22 and the seed rod holding portion 23 are respectively formed in a bar shape, and the seed rod holding portion 23 is coaxially screwed into the upper end portion of the electrode holder 22 and is fixed therewith by means of a nut member 24.

Figure 1:
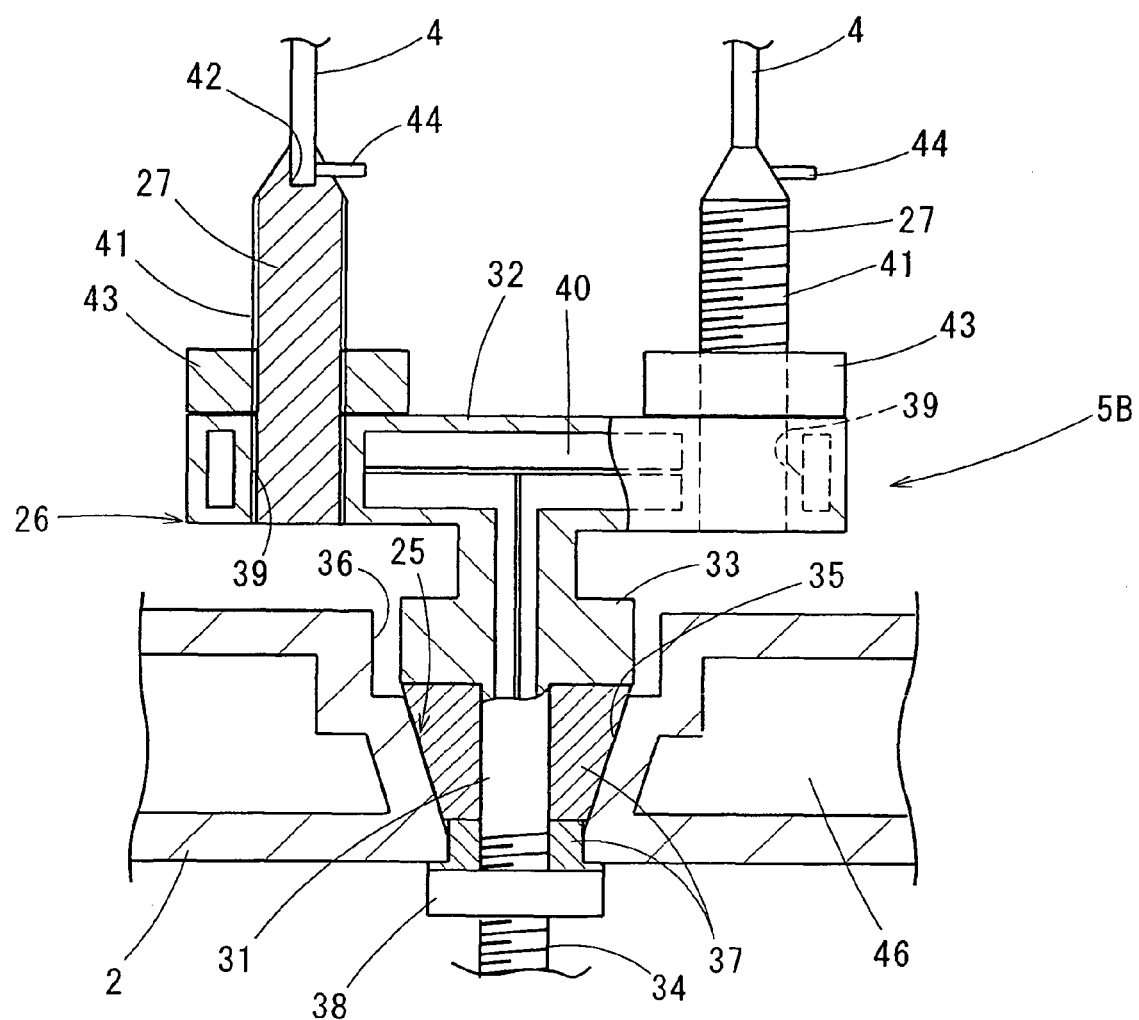
FIG. 1 is a sectional view showing an electrode of a polycrystalline silicon manufacturing apparatus according to a first embodiment of the present invention.

As magnificently shown in FIG. 1, the configuration of the two-holding electrode 5B including an electrode holder 26 which is inserted in the perforation hole 25 formed in the bottom plate portion 2 of the reaction furnace 1 and seed rod holding portions 27 which are formed in the upper end portion of the electrode holder 26 are the same as that of the one-holding electrode 5A. However, the electrode holder 26 is branched into two parts at the upper end portion thereof and both end portions thereof are provided with the seed rod holding portions 27.

The electrode holder 26 is made of a conductive material such as stainless steel, and a rod portion 31 which is formed in a bar shape as a whole is integrally formed with an arm portion 32 which is formed perpendicular to the upper end of the rod portion 31. The rod portion 31 is integrally formed with a large width portion 33 formed at a position in the course of the rod portion 31 in a longitudinal direction, and an outer periphery of a portion below the large width portion 33 is provided with a male screw portion 34.

On the other hand, the perforation hole 25 of the bottom plate portion 2 in which the electrode holder 26 is inserted therein is provided with a counter bore 36 which is formed in the opening of the upper end of the perforation hole 25 and a taper portion 35 of which a width gradually increases in a direction toward the upside below the counter bore 36. Additionally, annular insulating materials 37 are provided between the inner peripheral surface of the perforation hole 25 and the rod portion 31 of the electrode holder 26 so as to surround the electrode holder 26, and are fastened between a nut member 38 screwed into the male screw portion 34 and the large width portion 33 of the rod portion 31 so as to be fixed to the bottom plate portion 2.

In addition, the arm portion 32 extends horizontally from the upper end of the rod portion 31 in right and left directions respectively so as to be perpendicular to the rod portion 31, and forms a T-shape as a whole together with the rod portion 31, both portions adjacent to right and left ends being provided with female screw holes 39 which are formed in a perpendicular direction. Since the rod portion 31 and the arm portion 32 are formed in a T-shape, the seed rod holding portions 27 and the rod portion 31 supported to the bottom plate portion 2 are distanced from each other in a horizontal direction, thereby relieving stress therebetween. Additionally, a cooling passageway 40 for flowing a cooling medium is formed in the electrode holder 26 so as to pass around the periphery of the female screw holes 39 of the arm portion 32 from the rod portion 31.

On the other hand, the seed rod holding portion 27 is formed in a cylindrical shape by carbon or the like, the outer peripheral portion thereof is provided with a male screw portion 41 screwed into the female screw hole 39 of the electrode holder 26, and then the upper end portion thereof is provided with a hole 42 formed along the axis of the seed rod holding portion 27 so as to fix the silicon seed rods 4 therein in inserted states. Additionally, the male screw portion 41 is screwed into the female screw hole 39 of the electrode holder 26 and is fixed by means of a nut member 43. The silicon seed rod 4 inserted in the hole 42 formed in the upper end portion is fixed by means of setscrew 44.

In addition, in the one-holding electrode 5A and the two-holding electrode 5B, as shown in FIG. 2, for example, one one-holding electrode 5A, two two-holding electrodes 5B, and one one-holding electrode 5A are sequentially arranged from the end of the row of the unit so that the three pairs of seed assemblies 13 are connected to each other in series in the form of one unit. In this case, three pairs of seed assemblies 13 are serially connected so as to pass through one-holding electrode 5A to two-holding electrode 5B, two-holding electrode 5B to two-holding electrode 5B, and two-holding electrode 5B to one-holding electrode 5A, and both silicon seed rods 4 of one seed assembly 13 are held by different adjacent electrodes. That is, the one-holding electrode 5A holds one of two silicon seed rods 4 of the seed assembly 13, and the two-holding electrode 5B holds each of the silicon seed rods 4 of two pairs of seed assemblies 13. Then, power source cables 45 are connected to the one-holding electrodes 5A provided at both ends of the row, and a current flows as depicted by the chained arrow of FIG. 2. At this time, in the two-holding electrode 5B, a current flows between both seed rod holding portions 27 through the arm portion 32.

Additionally, in FIG. 1, reference numeral 46 indicates a cooling passageway of the bottom plate portion 2 having a jacket structure. In FIG. 2, reference numeral 47 indicates a water supply pipe for supplying a cooling water to the cooling passageway in the electrode holder, and reference numeral 48 indicates a water discharge pipe for discharging the cooling water passing through the inside of the electrode holder.

In the polycrystalline silicon manufacturing apparatus with the above-described configuration, a current is supplied from the electrodes 5A and 5B to the silicon seed rods 4 so that the silicon seed rods 4 are in a resistance heating state. Also, the silicon seed rods 4 are heated by a radiation heat from the adjacent silicon seed rods 4 with each other so that a temperature thereof increases synergistically so as to be in a high-temperature state. Subsequently, the raw gas coming into contact with the surfaces of the silicon seed rods 4 in a high-temperature state causes a reaction, thereby depositing polycrystalline silicon.

In this case, since two types of electrodes are provided and the two-holding electrodes 5B for holding two silicon seed rods 4 are provided, as compared with the case where each of all the silicon seed rod is held by the one-holding electrode, it is possible to decrease the number of electrodes perforating the bottom plate portion 2 of the reaction furnace 1 and thus to decrease the number of perforation holes formed in the bottom plate portion 2 of the reaction furnace 1. As a result, it is possible to obtain a bottom plate portion 2 having a rigid structure. In other words, since it is possible to hold many silicon seed rods 4 by means of the small number of electrodes, it is possible to install many silicon seed rods 4 in the reaction furnace 1 and to improve productivity. Additionally, since the number of electrodes is small, it is possible to decrease the number of power source cables 45 or cooling pipes 47 and 48 disposed below the bottom plate portion 2, and thus to improve maintenance workability thereof.

Figure 4:
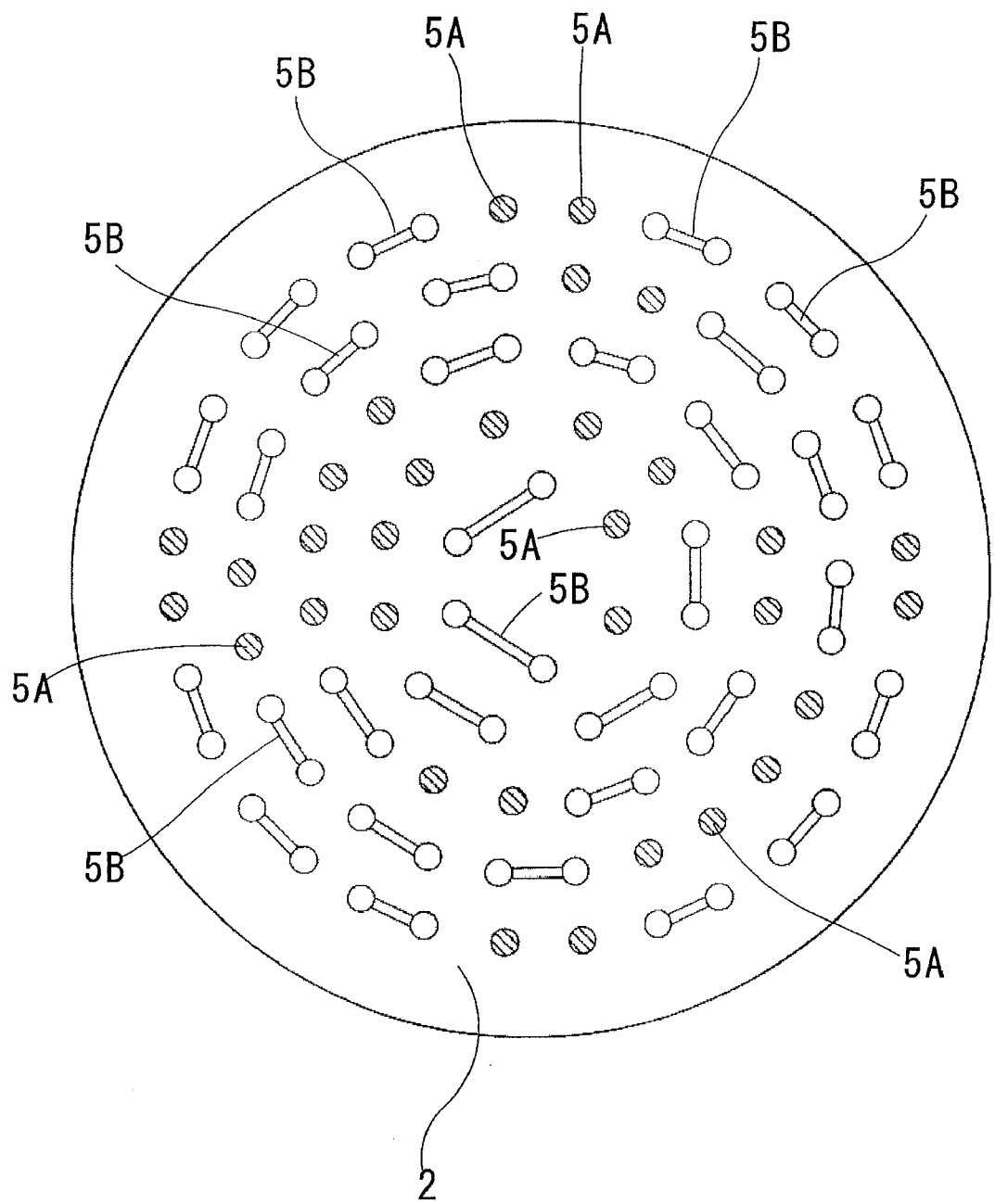
FIG. 4 is a plan view showing an example of the electrodes arranged on a bottom plate portion of the polycrystalline silicon manufacturing apparatus shown in FIG. 3.

FIG. 4 is a view showing an example of the electrodes arranged on the bottom plate portion 2 of the reaction furnace 1, both of the number of one-holding electrodes 5A and two-holding electrodes 5B arranged thereon are thirty two, and then the number of silicon seed rods held by the electrodes 5A and 5B is ninety six. The number of perforation holes formed in the bottom plate portion 2 so as to insert the electrodes 5A and 5B is sixty four. On the contrary, in the case where all the electrodes are configured as the one-holding electrode 5A, ninety six perforation holes are required. However, the number of perforation holes decreases by two-thirds by combination with the two-holding electrodes 5B. Additionally, the number of cooling pipes or the like disposed at the lower end portion of each electrode below the bottom plate portion 2 decreases.

In addition, the present invention is not limited to the configuration of the above-described first embodiment, but a detailed configuration may be modified into various forms within the scope of the present invention without departing from the spirit of the present invention. For example, in the example shown in FIG. 2, two one-holding electrodes and two two-holding electrodes are used to connect three pairs of seed assemblies in series in a form of one unit. However, four or more pairs of seed assemblies may be connected to each other in a form of one unit by increasing the number of two-holding electrodes at the middle position. Further, in the above-described first embodiment, a case is exemplified in which the power source cable is not connected to the two-holding electrode. However, like the second embodiment shown in FIG. 5, the two-holding electrode 5B may be connected to the power source cable 45, and one unit may be separated into plural units (the number is two in the example shown in FIG. 5) so as to be electrically connected to each other. In this case, in the silicon seed rod 4, an electric resistance is large during an initial operation, and the electric resistance decreases in accordance with an increase of the diameter of the silicon seed rod 4. Accordingly, a current supply path from a power source circuit 50 may be configured to be switched in accordance with the increase of the diameter of the silicon seed rod 4 so as to adopt a type in which a current is supplied to one unit connected in series or a type in which a current is supplied to each of the plural separated units.

Figure 5:
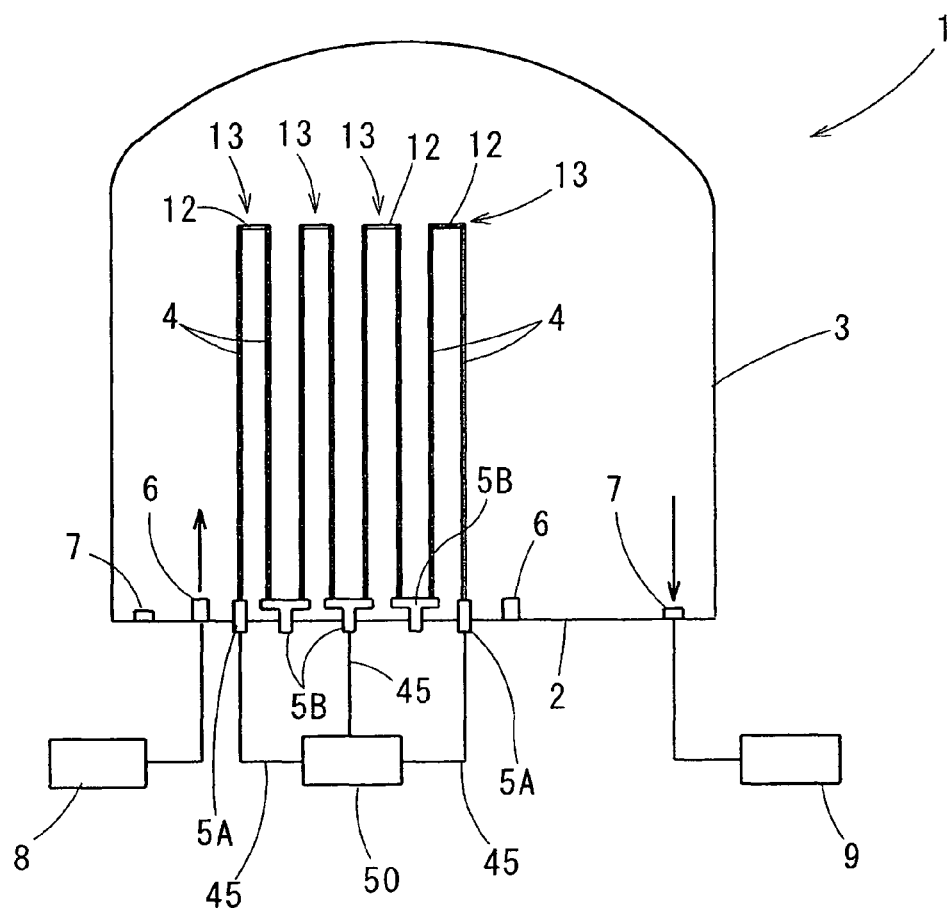
FIG. 5 is a longitudinal sectional view showing an overall configuration according to a second embodiment of the present invention.

In the present invention, the electrode includes a portion in which a current is supplied to the silicon seed rod from the outside like the one-holding electrode in the first embodiment and the one-holding and two-holding electrodes shown in FIG. 5 in the second embodiment and a portion in which the silicon seed rods are electrically connected to each other like the two-holding electrode in the first embodiment.

While preferred embodiments of the present invention have been described and illustrated above, it should be understood that these are exemplary of the present invention and are not to be considered as limiting. Additions, omissions, substitutions, and other modifications can be made without departing from the spirit or scope of the present invention. Accordingly, the present invention is not to be considered as being limited by the foregoing description, and is only limited by the scope of the appended claims.

What is claimed is:

1. A polycrystalline silicon manufacturing apparatus which supplies raw gas to the inside of a reaction furnace and supplies a current from an electrode to a silicon seed rod in a state where the vertically extending silicon seed rod is uprightly stood on each of the plural electrodes disposed in a bottom plate portion of the reaction furnace so as to heat the silicon seed rod and thus to deposit polycrystalline silicon on a surface of the silicon seed rod by means of the reaction of the raw gas,
    wherein at least a part of the plural electrodes is configured as a two-holding electrode which holds two silicon seed rods;
    each two-holding electrode includes only one electrode holder which is inserted in a perforation hole formed in the bottom plate portion and a pair of seed rod holding portions which are formed in an upper end portion of the electrode holder so as to have an interval therebetween;
    the pair of seed rod holding portions are supported by the electrode holder with respect to the bottom plate;
    a cooling passageway is formed in the inside of the electrode holder so as to flow a cooling medium; and
    a lower end portion of the electrode holder perforating the bottom plate portion is connected to a cooling pipe communicating with the cooling passageway.

2. The polycrystalline silicon manufacturing apparatus according to claim 1, wherein the silicon seed rods are formed into seed assemblies in which upper end portions of two silicon seed rods are connected to each other,
    wherein both seed rod holding portions of each two-holding electrode respectively hold each one of silicon seed rods of two pairs of the seed assemblies; and
    the two seed rod holding portions of each two-holding electrode are electrically connected to each other through the electrode holder of the each two-holding electrode.

3. The polycrystalline silicon manufacturing apparatus according to claim 2, wherein plural pairs of seed assemblies are held by a pair of one-holding electrodes and the two-holding electrode disposed between the one-holding electrodes so as to be connected to each other in series in the form of one unit,
    wherein a power source circuit which supplies a current to the seed assemblies is connected to the one-holding electrode and the two-holding electrode; and
    a current supply to the one unit and a current supply to separated units obtained by separating the one unit into plural units are configured to be switched.

4. The polycrystalline silicon manufacturing apparatus according to claim 2, wherein each seed assembly has a pair of silicon seed rods and a connecting member connecting the upper end portions of the pair of silicon seed rods.

5. The polycrystalline silicon manufacturing apparatus according to claim 1, wherein the electrode holder of each two-holding electrode is branched into two branched parts at the upper end portion thereof, and the pair of seed rod holding portions are respectively formed on the branched parts.

6. The polycrystalline silicon manufacturing apparatus according to claim 5, wherein the electrode holder of each two-holding electrode has a T-shape as a whole.

* * * * *